United States Patent
Wulff et al.

(10) Patent No.: US 7,522,889 B2
(45) Date of Patent: Apr. 21, 2009

(54) RUGGED DESIGN FOR HAND HELD MOBILE TERMINALS

(75) Inventors: Thomas Wulff, North Patchogue, NY (US); Robert A. Spano, Smithtown, NY (US); Azer Ilkhanov, Brooklyn, NY (US); Mitchell Maiman, Holbrook, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 776 days.

(21) Appl. No.: 10/334,530

(22) Filed: Dec. 30, 2002

(65) Prior Publication Data

US 2004/0127270 A1 Jul. 1, 2004

(51) Int. Cl.
*H04B 1/38* (2006.01)
(52) U.S. Cl. ............... 455/90.3; 455/575.1; 455/575.8; 455/569.1; 455/550.1; 455/348; 455/556.2; 379/428.01; 379/433.01; 379/433.11
(58) Field of Classification Search ............... 455/90.1, 455/569.1, 90.3, 575.1, 556.2, 557, 556.1, 455/575.8, 348, 550.1; 379/428.01, 433.01, 379/433.11
See application file for complete search history.

(56) References Cited

U.S. PATENT DOCUMENTS

| | | | | |
|---|---|---|---|---|
| 5,479,479 A * | 12/1995 | Braitberg et al. | ......... | 455/404.1 |
| 5,777,856 A | 7/1998 | Phillips et al. | | |
| 6,052,279 A * | 4/2000 | Friend et al. | ................ | 361/686 |
| 6,101,403 A * | 8/2000 | Masuda | .................... | 455/569.2 |
| 6,118,663 A * | 9/2000 | Fan | ............................. | 361/725 |
| 6,207,912 B1 * | 3/2001 | Persson | ...................... | 200/305 |
| 6,246,862 B1 * | 6/2001 | Grivas et al. | ................ | 455/566 |
| 6,282,088 B1 * | 8/2001 | Canova et al. | .............. | 361/686 |
| 6,311,896 B1 * | 11/2001 | Mulla et al. | ............ | 235/472.03 |
| 6,356,443 B2 * | 3/2002 | Jenks et al. | .................. | 361/686 |
| 6,381,126 B1 * | 4/2002 | Yoshimoto et al. | .......... | 361/683 |
| 6,388,870 B1 * | 5/2002 | Canova et al. | .............. | 361/683 |
| 6,388,877 B1 * | 5/2002 | Canova et al. | .............. | 361/686 |
| 6,483,719 B1 * | 11/2002 | Bachman | ..................... | 361/816 |
| 6,486,862 B1 * | 11/2002 | Jacobsen et al. | .............. | 345/88 |
| 6,490,439 B1 * | 12/2002 | Croft et al. | .................. | 455/90.1 |
| 6,532,152 B1 * | 3/2003 | White et al. | ................. | 361/692 |

(Continued)

FOREIGN PATENT DOCUMENTS

DE            29618043 UI            12/1996

(Continued)

OTHER PUBLICATIONS

International Search Report, PCT/US03/35756, mailed May 25, 2004.

(Continued)

*Primary Examiner*—Marceau Milord
(74) *Attorney, Agent, or Firm*—Amin, Turocy & Calvin, LLP

(57) ABSTRACT

Systems and methods for a rugged hand held mobile terminal design are provided. The mobile terminal design includes a monocoque enclosure for housing electronic components. The electronic components are mounted on a rail system, which is positioned within an interior portion of the enclosure through an open end of the enclosure. The mobile terminal design also includes a display bezel. The display bezel and the rail system have mating parts for securing the assembly together.

22 Claims, 6 Drawing Sheets

U.S. PATENT DOCUMENTS

| | | | |
|---|---|---|---|
| 6,535,199 B1 * | 3/2003 | Canova et al. | 345/168 |
| 6,625,469 B1 * | 9/2003 | Hwang et al. | 455/550.1 |
| 6,690,947 B1 * | 2/2004 | Tom | 455/556.1 |
| 6,707,581 B1 * | 3/2004 | Browning | 358/473 |
| 6,711,419 B1 * | 3/2004 | Mori | 455/556.1 |
| 6,718,188 B1 * | 4/2004 | Ohira et al. | 455/575.1 |
| 6,724,618 B1 * | 4/2004 | Jenkins et al. | 361/684 |
| 6,763,576 B2 * | 7/2004 | Watchko et al. | 29/825 |
| 6,788,285 B2 * | 9/2004 | Paolucci et al. | 345/156 |
| 6,870,730 B2 * | 3/2005 | Riddiford | 361/681 |
| 6,968,161 B2 * | 11/2005 | Inomata et al. | 455/90.3 |
| 6,978,123 B2 * | 12/2005 | Fuhrmann et al. | 455/90.3 |
| 7,061,762 B2 * | 6/2006 | Canova et al. | 361/696 |
| 7,072,624 B2 * | 7/2006 | Zheng et al. | 455/90.3 |
| 7,099,709 B2 * | 8/2006 | Hsu et al. | 455/575.8 |
| 2002/0061736 A1 * | 5/2002 | Boman et al. | 455/90 |

FOREIGN PATENT DOCUMENTS

EP            1209880 A        5/2002

OTHER PUBLICATIONS

European Search Report dated Mar. 21, 2007 for European Patent Application Serial No. 03 78 3273, 1 Page.

* cited by examiner

RUGGED DESIGN FOR HAND HELD MOBILE TERMINALS

TECHNICAL FIELD

The present invention generally relates to portable electronic devices. In particular, the present invention relates to systems and methods for a rugged design for hand held mobile terminals.

BACKGROUND OF THE INVENTION

Hand held mobile terminals, such as personal digital assistants (PDAs), have become widely accepted as personal and business organizational tools. Many users carry hand held mobile terminals on a daily basis. Accordingly, it is desired that housings for mobile terminals meet a number of criteria. A housing for a hand held mobile terminal should be aesthetically appealing. Moreover, the housing should be rugged to protect inner electronics from damage in the event of a drop. As mobile terminals become more and more powerful, a need for strength in the housing is at odds with a need to minimize volume occupied by the housing, and thus unavailable for packaging the electronics. Further, any latching mechanism used to hold the housing together should minimize any volume occupied and provide a secure latching system to prevent the disengagement of the housing parts.

Hand held mobile terminals are generally assembled by enclosing internal electrical components, such as a Central Processing Unit (CPU) board, display, keyboard, and internal wiring, within a housing made of plastic or another structural material. The enclosure is normally formed in two parts having an upper housing and a lower housing. The electronic components are mounted to one or both sides of the housing with or without a subframe. A subframe is employed to provide torsional rigidity to the structure. The display and sometimes the battery are also located within the enclosure. The display and the battery represent large masses that can impart undesirable impact loads to the CPU board during a drop event.

FIG. 1 depicts a conventional housing 100 for a hand held mobile terminal. The housing 100 comprises two halves 110 and 120. The two halves 110 and 120 are fastened together to contain electronics (not shown). Bosses 130 are included in the housing 100 such that fasteners 140 can penetrate both sides of the housing 100. The fasteners, or screws, 140 are inserted through bosses 130 on one half of the housing 100 through to the other half of the housing to provide the closing force needed to hold the assembly together. These features use volume that would otherwise be utilized for electrical components. Thus, the existence of bosses 130 reduces volumetric efficiency of the housing 100.

Additionally, the assembly of the components into the housing 100 requires several manufacturing processes. Before the housing 100 is fastened together, the CPU board, the display and other components must be assembled to a subframe, to the housing, or to some other subassembly. Such assembly steps are generally time consuming and expensive in manufacturing.

Further, the conventional housing assembly has poor torsional rigidity due to discontinuity of the housing surfaces at the mating band. Accordingly, stresses from deflections and impact loads during a drop are concentrated at the bosses 130. Housing failure is often attributed to boss failure caused by deflection and impact load stresses.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides systems and methods for a rugged hand held mobile terminal design. The mobile terminal includes a monocoque enclosure and a rail system provided within the monocoque enclosure. The rail system has electronic components for operation of the mobile terminal mounted thereon. Since the monocoque enclosure is a substantially one-piece cavity, the need for bosses and/or fastening hardware is mitigated. The mobile terminal also includes a display and display bezel. The display bezel includes at least one latch mechanism which corresponds with at least one notch and/or aperture formed in the rail system. Accordingly, the display bezel and rail system effectively exert a downward force on a gasket positioned around the display, which forms an environmental seal. Compressive loads are transferred to a top surface of the monocoque enclosure. The rail system can be further secured to the enclosure via a fastening mechanism (e.g., screw). The present invention provides several advantages over the conventional mobile terminal housing, such as: better torsional rigidity, simplified assembly, improved volumetric efficiency, reduced need for shock absorbing materials, lighter overall weight, decoupling of impact loads, and mitigation of stress concentrations.

To the accomplishment of the foregoing and related ends, the invention then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed and the present invention is intended to include all such aspects and their equivalents. Other objects, advantages and novel features of the invention will become apparent from the following detailed description of the invention when considered in conjunction with the drawings.

DETAILED DESCRIPTION OF THE INVENTION

Figure 1:
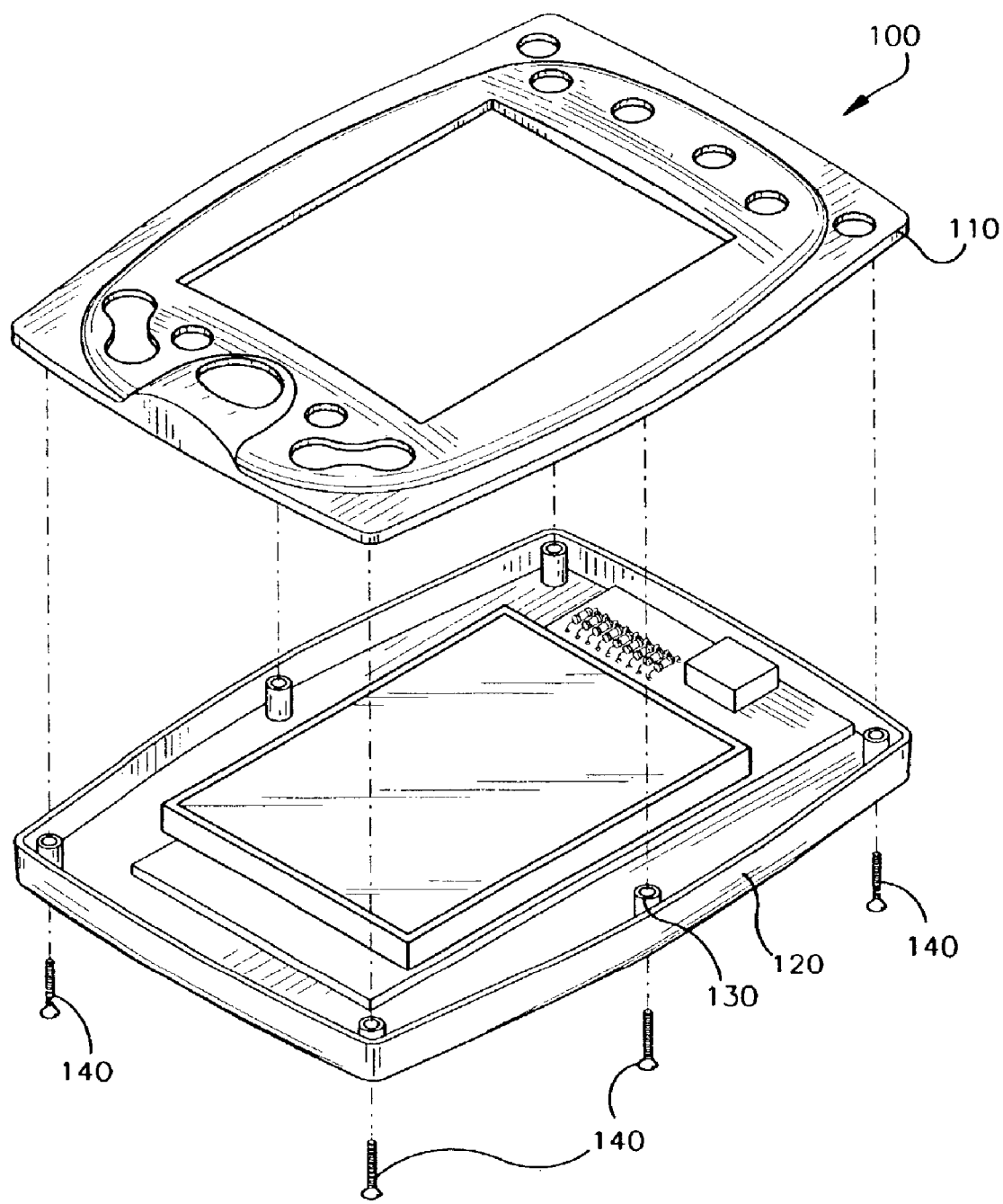
FIG. 1 illustrates a conventional hand held mobile terminal housing.

The present invention relates to systems and methods for a rugged hand held mobile terminal design. The present invention will now be described with reference to the drawings, wherein like reference numerals are used to refer to like elements throughout. It is to be appreciated that the various drawings are not drawn to scale from one figure to another nor inside a given figure, and in particular that the size of the components are arbitrarily drawn for facilitating the reading of the drawings. In the following description, for purposes of explanation, numerous specific details are set forth in order to provide a thorough understanding of the present invention. It may be evident, however, that the present invention may be practiced without these specific details. In other instances, well-known structures and devices are shown in block form in order to facilitate describing the present invention.

Figure 2:
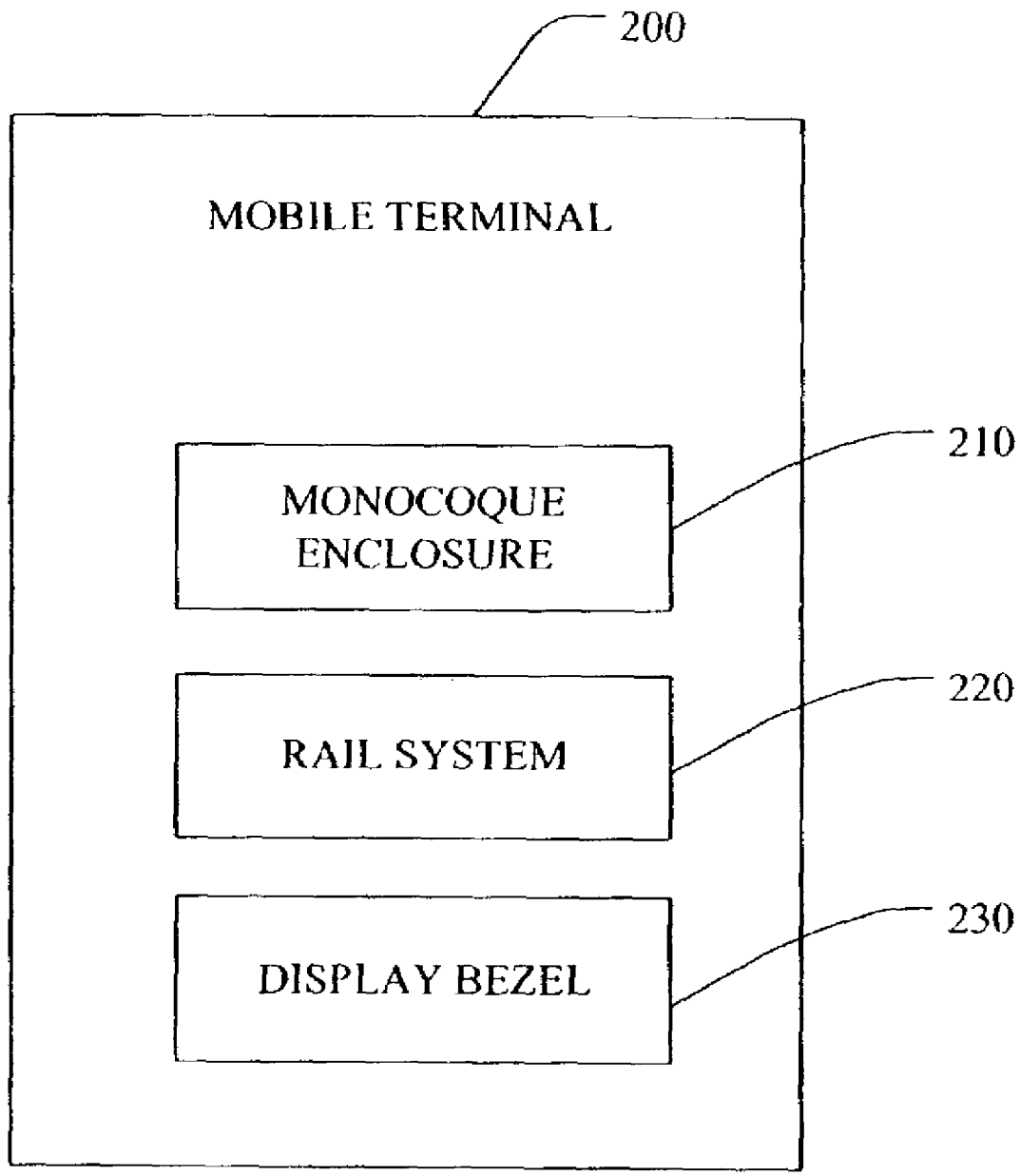
FIG. 2 illustrates a schematic block diagram of a rugged hand held mobile terminal design in accordance with an aspect of the present invention.

Referring initially to FIG. 2, a system 200 for a rugged hand held mobile terminal design is illustrated. The hand held mobile terminal 200 can be a palm top ("palm-sized") portable computer system, a cellular telephone, global positioning system (GPS), bar code scanner, or the like. The hand held mobile terminal 200 includes a monocoque enclosure 210, a rail system 220, and a display bezel 230. The monocoque enclosure 210 is a substantially one-piece casing employed to house electronic components. The electronic components are mounted to the rail system 220; and the rail system 220 is placed in an interior portion of the monocoque enclosure 210. The rail system 220 and display bezel 230 include mating parts such that they are operative to secure the monocoque enclosure 210, the rail system 220, and the display bezel 230 in place. Accordingly, assembly time for the hand held mobile terminal housing is decreased relative to the conventional design. Further, rigidity of the mobile terminal housing 200 is increased as the monocoque enclosure 210 does not contain discontinuities at a mating band, as compared to conventional housings (e.g., housing 100).

Figure 3:
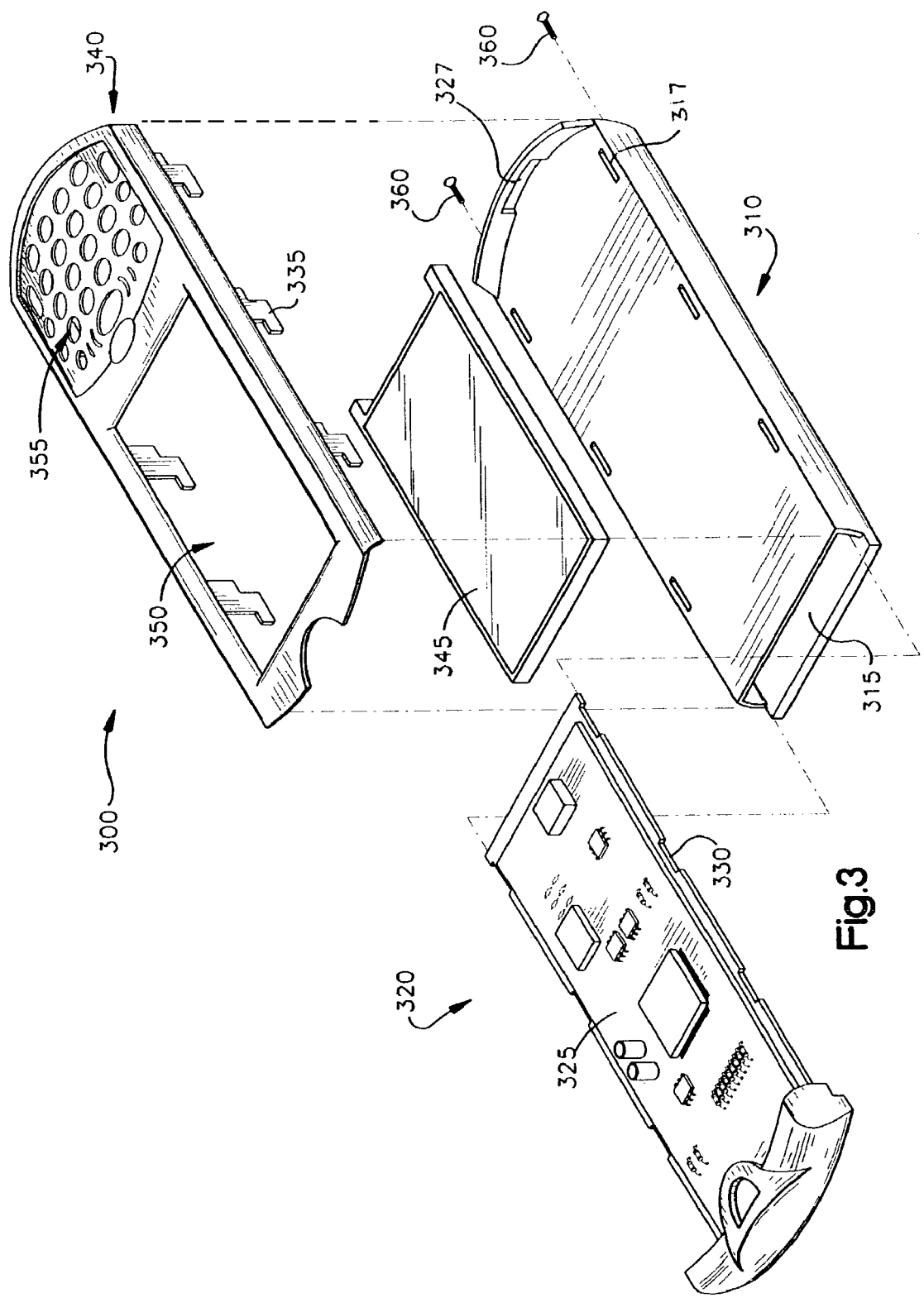
FIG. 3 illustrates an exploded view of a hand held mobile terminal housing in accordance with an aspect of the present invention.

FIG. 3 illustrates an example of a rugged hand held mobile terminal 300 in accordance with an aspect of the present invention. The rugged design of the mobile terminal 300 improves mechanical efficiency and reduces assembly time for the terminal 300. The mobile terminal 300 comprises a monocoque enclosure 310, which houses a CPU board and provides structural rigidity for the mobile terminal 300. The monocoque enclosure 310 can be fabricated from metal, plastic, or any other suitable structural material. Bosses and/or fastening hardware as required by conventional housings are unnecessary in the mobile terminal 300 of the present invention as the monocoque enclosure 310 is a substantially one-piece casing. Thus, external loads are carried by the enclosure without discontinuities or stress concentrations. Accordingly, the structure of the mobile terminal 300 is more rigid than the conventional two-piece design.

The monocoque enclosure 310 includes an open end 315 for receiving electronic components 325. The electronic components 325 include a PC board containing electronics and logic (e.g., memory, communication bus, and processor) for implementing computer system functionality. It is to be appreciated that although the open end 315 is illustrated as being located at a top portion of the monocoque enclosure 310, the open end 315 can also be located at any other portion of the monocoque enclosure 310, such as at a bottom portion or a side portion. Another opening 327 is included in the monocoque enclosure 310 for allowing access to a communication interface (not shown). For example, the communication interface can be a serial communication port and/or any other suitable communication standard and/or protocol, e.g., parallel, SCSI, Firewire (IEEE 1394), Ethernet, etc. Similarly, the communication interface opening can also be located anywhere on the enclosure and is contemplated as falling within the scope of the present invention. The monocoque enclosure 310 further includes at least one latch receiving aperture 317 for receiving a corresponding latch member, as will be described in more detail below. FIG. 3 depicts three latch receiving apertures 317 on opposing sides of a front surface of the monocoque enclosure 310; however, it is to be appreciated that any number of latch receiving apertures can be included anywhere on the enclosure 310.

The hand held mobile terminal 300 also includes a rail system 320 which acts as a subframe for internal components of the mobile terminal 300, as well as an assembly backbone for the mobile terminal 300. Circuitry 325 for the hand held mobile terminal 300, some of which can be implemented on a PC board, is coupled to the rail system 320. A processor, read only memory (ROM), random access memory (RAM), and bus can form a platform for the mobile terminal 300. For example, the circuitry 325 can include an address/data bus for communicating information, a central processor coupled with the bus for processing information and instructions, a volatile memory (e.g., random access memory RAM) coupled with the bus for storing information and instructions for the central processor and a nonvolatile memory (e.g., read only memory ROM) coupled with the bus for storing static information and instructions for the processor. The mobile terminal 300 can also include an optional data storage device (e.g., memory stick) coupled with the bus for storing information and instructions. The rail system 320 is secured to the enclosure 310 by screws 360, or any other suitable fastener, acting in tension from a bottom of the enclosure 310.

Also included in hand held mobile terminal 300 is a display 345 for displaying information to a user. The display 345 can be a touch screen and may employ capacitive, resistive touch, infrared, surface acoustic wave, or grounded acoustic wave technology. Further, the display 345 can be a liquid crystal device, cathode ray tube (CRT), field emission device (FED, also called flat panel CRT) or any other display device suitable for creating graphic images and alphanumeric characters recognizable to the user. The mobile terminal 300 can also include an optional alphanumeric input device (not shown). For instance, the input device can be a handwriting recognition pad ("digitizer") which communicates information and command selections to a central processor. The terminal 300 can include an optional cursor control or directing device coupled to the bus for communicating user input information and command selections to the central processor.

The display 345 corresponds with an opening 350 in a bezel or cover 340. The bezel 340 also includes one or more openings 355 for a keyboard and/or programmable buttons for selecting information and causing the mobile terminal 300 to implement functions. At least one latch 335 is formed in the bezel 340 for securing the bezel 340 to the hand held mobile terminal 300. The latch 335 corresponds with at least one notch and/or aperture 330 formed in the rail system 320. For example, the latch 335 can be a substantially L-shaped member, and the notch and/or aperture 330 can be an open notch formed in a side portion of the rail system 320, as depicted in FIG. 3. Alternatively, the notch and/or aperture 330 can be an opening or a slot formed in the rail system 320. A plurality of L-shaped members can slidably engage with a plurality of corresponding notches and/or apertures in the rail system.

Accordingly, as the rail system 320 is positioned within the enclosure 310, the engagement between the L-shaped members 335 and the notches and/or apertures 330 effectively draws the bezel 340 toward the monocoque enclosure 310. It is to be appreciated that any other suitable mechanism for coupling the bezel 340 with the rail system 320 can be employed and is contemplated as falling within the scope of the present invention.

When the bezel 340 is securely in place via the engagement between the latch(es) and the notch(es) and/or aperture(s), a downward force is exerted on a gasket (not shown), which provides a seal between the bezel 340 and the display 345. The gasket is provided about a perimeter of the display opening 350 of the bezel 340 and/or the display itself 345 and is operable to keep out contamination, which might otherwise enter the mobile terminal assembly from outside and thereby affect performance of the mobile terminal 300. The gasket can be of rubber, foam, or any other elastomer, operable to sufficiently seal the assembly of the mobile terminal 300. The seal mitigates dust and other contaminates from entering the clean environment of the mobile terminal 300.

Figure 4:
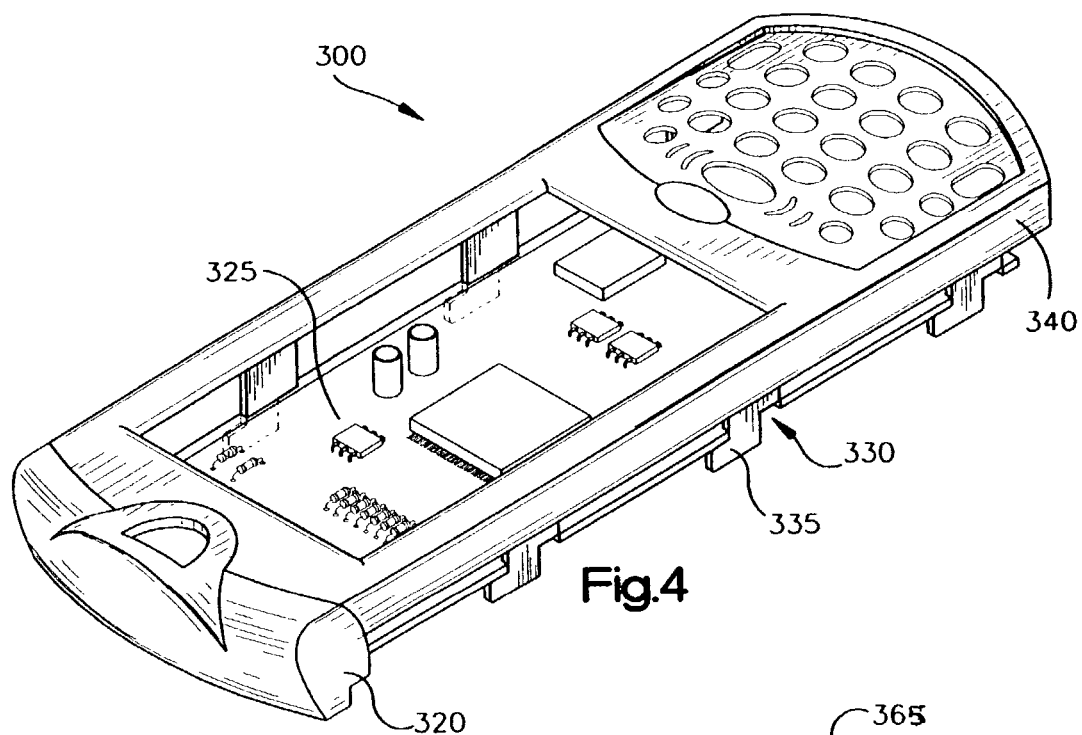
FIG. 4 illustrates a perspective view of housing components of a hand held mobile terminal in accordance with an aspect of the present invention.

FIG. 4 illustrates an example of the coupling between the display/keyboard bezel 340 and the rail system 320. When the bezel 340 is assembled to the rail system 320, L-shaped members, or latches, 335 are aligned with corresponding latch receiving notches and/or apertures 330 on the rail system 320. The bezel 340 is then slidably moved into engagement with the rail system 320. Thus, to assemble the mobile terminal 300, the rail system 320 is moved into the open end 315 of the monocoque enclosure 310. The display 345 is coupled to the rail system 320 via mating connectors (not shown). The bezel 340 is then positioned over the monocoque enclosure 310 such that the latches 335 are inserted into the latch receiving apertures 317 in the monocoque enclosure 310. The bezel 340 is then slidably moved such that the latches 335 are securely engaged with the latch receiving notches and/or apertures 330 on the rail system 320. Thus, the latches 335 are engaged with the latch receiving notches and/or apertures 330 within an interior portion of the monocoque enclosure 310. Accordingly, the possibility of disengagement of the housing 300 during impact is substantially reduced. When the bezel 340 and rail system 320 are assembled, the mobile terminal housing 300 is further strengthened by securing the rail system 320 to the monocoque enclosure 310 by screws 360 (FIG. 3) acting in tension from a bottom portion of the enclosure 310. The bezel 340 and rail system 320 can be disassembled by slidably disengaging the latches 335 and the mating notches and/or apertures 330.

Figure 5:
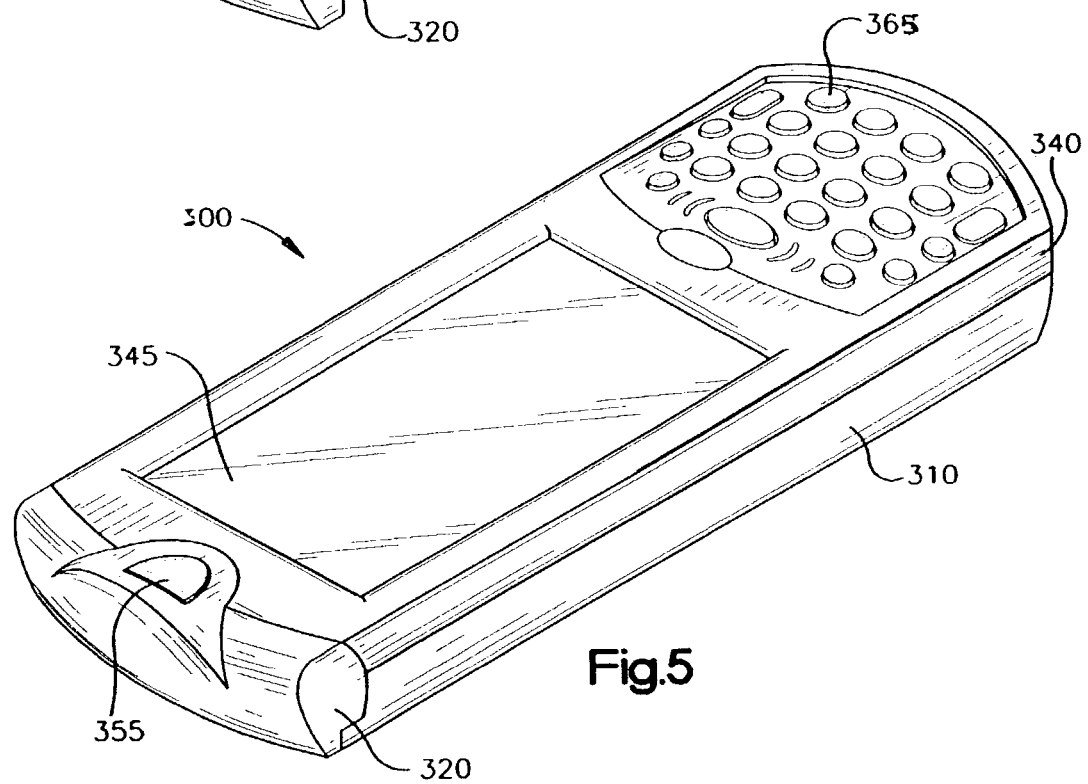
FIG. 5 illustrates a perspective view of a hand held mobile terminal design in accordance with an aspect of the present invention.

Turning now to FIG. 5 a perspective view of the hand held mobile terminal 300 as assembled is depicted. It will be appreciated that the portable device could also be any other device that is portable in nature and having electronic circuitry therein in accordance with the present invention. For example, the portable device could be a laptop computer or notebook computer, a PDA, or even a cellular telephone or pager. The mobile terminal 300 includes a display 345, such as a touch screen, and a set of user interface keys 365. Both the touch screen 345 and the user interface keys 365 can be utilized for allowing a user to input information and/or operational commands. The touch screen 345 is further utilized to display information to the user and may employ capacitive, resistive touch, infrared, surface acoustic wave, or grounded acoustic wave technology. The user interface keys may include a full alphanumeric keypad, function keys, enter keys, etc. The housing of the mobile terminal 300 is generally of an elongated enclosure which includes such contours as to conveniently fit into the open palm of the user. The housing comprises a monocoque enclosure 310, a rail system 320, and a bezel 340. A speaker 355 can also be included to transmit and/or receive audio information to and from the user.

The mobile terminal 300 can also include a window (not shown) in which a bar code reader is able to read a bar code label, or the like, presented to the mobile terminal 300. The mobile terminal 300 can include a LED (not shown) that is illuminated to reflect whether the bar code has been properly or improperly read. Alternatively, or additionally, a sound may be emitted from the speaker to alert the user that the bar code has been successfully imaged and decoded.

Figure 6:
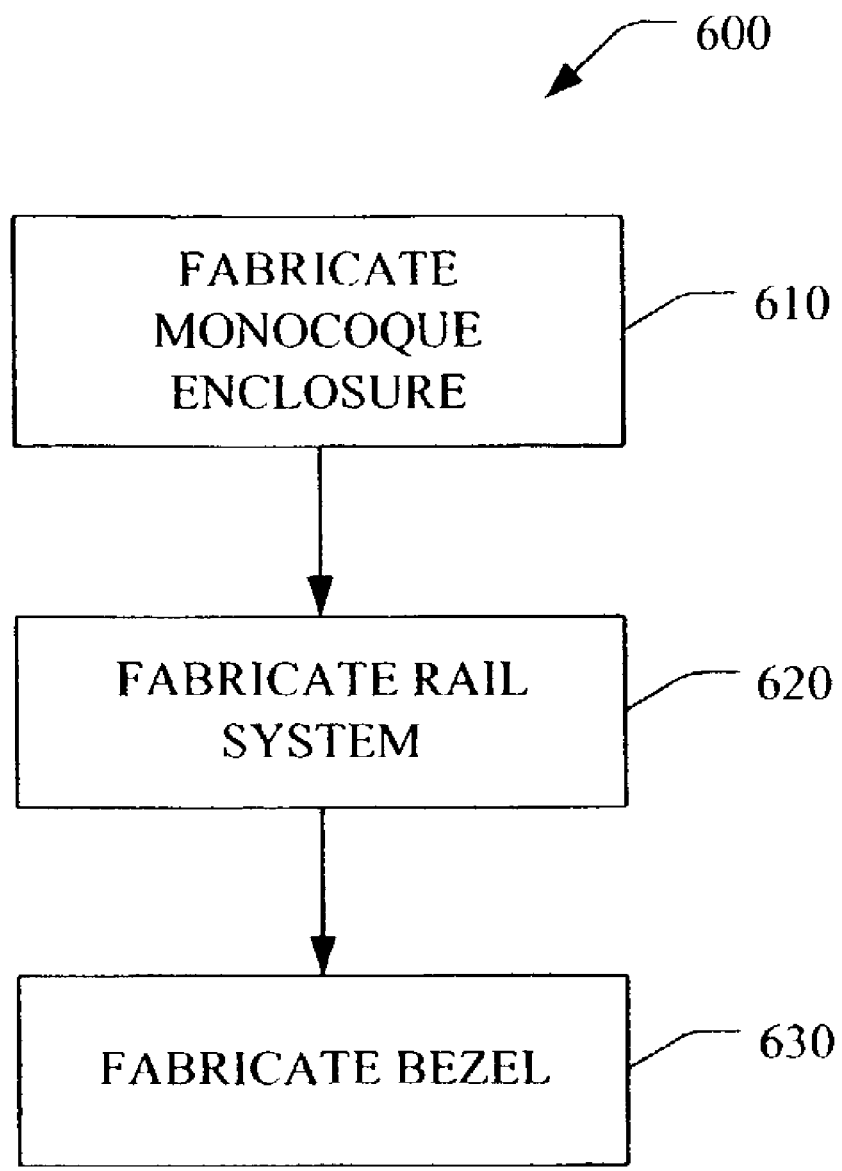
FIG. 6 illustrates a methodology for fabricating a hand held mobile terminal housing in accordance with an aspect of the present invention.
Figure 7:
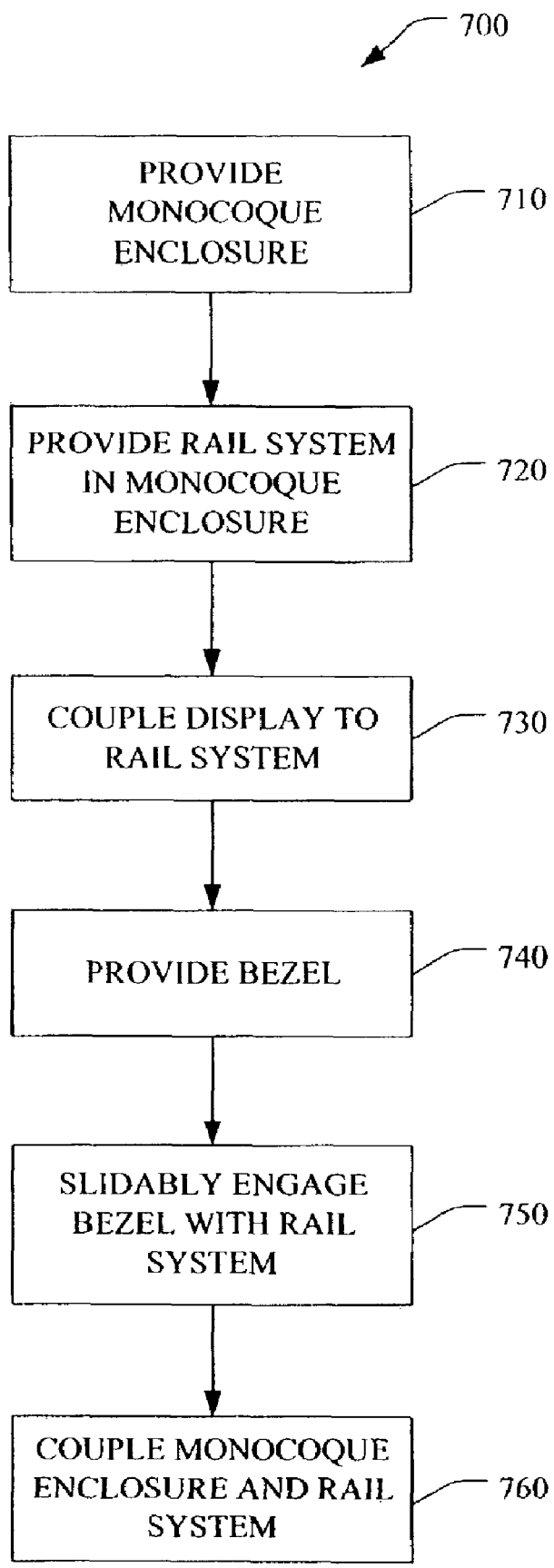
FIG. 7 illustrates a methodology for assembling a hand held mobile terminal in accordance with an aspect of the present invention.

In view of the foregoing structural and functional features described above, methodologies in accordance with various aspects of the present invention will be better appreciated with reference to FIGS. 6-7. While, for purposes of simplicity of explanation, the methodologies of FIGS. 6-7 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

Turning now to FIG. 6, a methodology 600 for fabricating a rugged hand held mobile terminal is illustrated. The methodology begins at 610 where a monocoque enclosure is fabricated from any suitable structural material, such as plastic and/or metal. The monocoque enclosure includes a substantially open end for receiving circuitry for the mobile terminal and apertures for receiving latches. At 620, a rail system is fabricated such that the rail can be inserted within the substantially open end of the enclosure. The rail system includes latch receiving notches and/or apertures which correspond with the apertures formed in the monocoque enclosure. At 630, a bezel is fabricated with openings for a display and, optionally, a keyboard. The bezel includes latches for coupling with the latch receiving notches and/or apertures in the rail system. Similarly, the rail system and the bezel can be of any suitable structural material.

FIG. 7 depicts a methodology for assembling a housing for a rugged hand held mobile terminal is depicted. The methodology begins at 710 where a monocoque enclosure is provided. The monocoque enclosure can be of any suitable material, such as plastic and/or metal. The monocoque enclosure includes a substantially open end and latch apertures. At 720, a rail system is provided in the open end of the monocoque enclosure. The rail system includes circuitry mounted thereon for operation of the mobile terminal. A display is coupled to the rail system via mating connectors at 730. Then, at 740, a bezel is provided over the assembly and latches of the bezel are inserted into the latch apertures of the monocoque enclosure. At 750, the latches are slidably engaged with latch receiving notches and/or apertures on the rail system. Screws, or any other suitable fasteners, are then provided at 760 to further couple the monocoque enclosure and the rail system for extra rigidity of the assembly.

It is to be appreciated that the rugged hand held mobile terminal design of the subject invention, as described herein, has wide applicability. The design can be employed for example in numerous types of commercial and industrial electronic devices (e.g., computers, personal digital assistants, cameras, electronic games . . . ). Moreover, the methodologies of the subject invention can be employed in connection with processes associated with fabricating rugged housings related to such devices. It is also to be appreciated that the scope of the present invention is intended to include any portable electronic device.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A hand held mobile terminal housing comprising:
    a rail system having electronics mounted thereon, the rail system supports one or more internal components and further acts as an assembly backbone for the mobile terminal;
    a monocoque enclosure, the electronics and a substantial portion of the rail system are housed within the monocoque enclosure; and
    a gasket that forms a coverless seal with the rail system to mitigate contaminates from entering the mobile terminal.

2. The hand held mobile terminal housing of claim 1, further comprising a bezel having at least one latch for coupling with the rail system.

3. The hand held mobile terminal housing of claim 2, the latch of the bezel is a substantially L-shaped member.

4. The hand held mobile terminal housing of claim 2, the rail system has at least one corresponding notch for slidably engaging with the latch of the rail system.

5. The hand held mobile terminal housing of claim 4, a latch receiving groove and the latch engage within an interior portion of the monocoque enclosure.

6. The hand held mobile terminal housing of claim 2, the rail system has at least one corresponding aperture for slidably engaging with the latch of the rail system.

7. The hand held mobile terminal housing of claim 1, further comprising a display.

8. The hand held mobile terminal housing of claim 7, the display and bezel are sealed via the gasket positioned around a perimeter of the display.

9. A personal digital assistant employing the housing of claim 1.

10. A cellular telephone employing the housing of claim 1.

11. An electronic game employing the housing of claim 1.

12. A barcode scanner employing the housing of claim 1.

13. A monocoque enclosure for a hand held mobile terminal comprising:
    a rail system that supports one or more internal components, the rails system acts as an assembly backbone for the mobile terminal;
    a gasket that forms a coverless seal with the rail system to mitigate contaminates from entering the monocoque enclosure;
    a substantially one-piece casing; and
    an open end formed in the casing for receiving electronic components mounted on the rail system, where a substantial portion of the rail system and the electronic components mounted thereon are adapted to be enclosed by the substantially one-piece casing.

14. The monocoque enclosure of claim 13, further comprising at least one aperture in the casing for receiving a corresponding latch.

15. The monocoque enclosure of claim 13, further comprising an opening in the casing for allowing access to a communication interface.

16. The monocoque enclosure of claim 13 being fabricated from metal.

17. The monocoque enclosure of claim 13 being fabricated from plastic.

18. A rail system for a hand held mobile terminal comprising:
    one or more rails to support one or more internal components, the rails act as an assembly backbone for the mobile terminal;
    a gasket that forms a coverless seal with a rail system to mitigate contaminates from entering the hand held mobile terminal; and
    a structure having a first portion and a second portion, the first portion is configured to be housed within an interior portion of a mobile terminal enclosure and the second portion is configured to correspond with an exterior portion of the mobile terminal enclosure.

19. The rail system of claim 18, the first portion of the structure has electronic components for the mobile terminal mounted thereon.

20. The rail system of claim 18, the first portion of the structure has at least one notch formed in a side portion of the structure for receiving a corresponding latch.

21. The rail system of claim 18, the first portion of the structure has at least one aperture formed therein for receiving a corresponding latch.

22. A method for fabricating a hand held mobile terminal housing comprising:
    coupling a rail system having electronics mounted thereon to an internal portion of a monocoque enclosure, the rail system supports one or more internal components and acts as a sub-frame that provides torsional rigidity for the mobile terminal and includes at least one aperature that draws the monocoque enclosure toward a bezel;
    strengthening the mobile terminal housing by securing the rail system to the monocoque enclosure in a manner that acts in tension from a bottom portion of the enclosure;
    coupling a display to the rail system;
    coupling the bezel to the rail system such that mating parts of the bezel and rail system engage within an interior portion of the monocoque enclosure; and
    coupling the display to the bezel on the rail system to form a coverless seal via a gasket to mitigate contaminates from entering the hand held mobile terminal.

* * * * *

UNITED STATES PATENT AND TRADEMARK OFFICE
CERTIFICATE OF CORRECTION

PATENT NO. : 7,522,889 B2
APPLICATION NO. : 10/334530
DATED : April 21, 2009
INVENTOR(S) : Wulff et al.

It is certified that error appears in the above-identified patent and that said Letters Patent is hereby corrected as shown below:

1. In Column 8, Line 44, in Claim 22, delete "aperature" and insert -- aperture --, therefor.

Signed and Sealed this

Ninth Day of February, 2010

David J. Kappos
*Director of the United States Patent and Trademark Office*